(12) United States Patent
Freedman

(10) Patent No.: US 11,187,825 B2
(45) Date of Patent: Nov. 30, 2021

(54) METHOD FOR FORMATION EVALUATION OF ORGANIC SHALE RESERVOIRS USING WELL LOGGING DATA

(71) Applicant: Schlumberger Technology Corporation, Sugar Land, TX (US)

(72) Inventor: Robert Freedman, Houston, TX (US)

(73) Assignee: SCHLUMBERGER TECHNOLOGY CORPORATION, Sugar Land, TX (US)

(*) Notice: Subject to any disclaimer, the term of this patent is extended or adjusted under 35 U.S.C. 154(b) by 552 days.

(21) Appl. No.: 15/775,317

(22) PCT Filed: Oct. 18, 2016

(86) PCT No.: PCT/US2016/057438
§ 371 (c)(1),
(2) Date: May 10, 2018

(87) PCT Pub. No.: WO2017/083059
PCT Pub. Date: May 18, 2017

(65) Prior Publication Data
US 2018/0321416 A1 Nov. 8, 2018

Related U.S. Application Data

(60) Provisional application No. 62/254,524, filed on Nov. 12, 2015.

(51) Int. Cl.
*G01V 3/38* (2006.01)
*G01V 3/32* (2006.01)
*G01R 33/44* (2006.01)

(52) U.S. Cl.
CPC .................. *G01V 3/38* (2013.01); *G01V 3/32* (2013.01); *G01R 33/448* (2013.01)

(58) Field of Classification Search
CPC ........... G01V 3/38; G01V 3/32; G01R 33/448
(Continued)

(56) References Cited

U.S. PATENT DOCUMENTS

| 4,359,687 A | 11/1982 | Vinegar et al. |
| 5,869,755 A | 2/1999 | Ramamoorthy et al. |

(Continued)

FOREIGN PATENT DOCUMENTS

CN 104912550 A 9/2015

OTHER PUBLICATIONS

Passey, A Practical Model for Organic Richness from Porosity and Restrictive Logs (Year: 1990).*

(Continued)

*Primary Examiner* — Michael P Nghiem
*Assistant Examiner* — Dacthang P Ngo

(57) ABSTRACT

Disclosed herein is a formation evaluation method including estimating a total porosity of an earth formation as a function of bulk density and total nuclear magnetic resonance (NMR) porosity of the earth formation. The total porosity of the earth formation as estimated underrepresents bitumen content. A gas filled porosity of the earth formation is estimated as a function of the bulk density and the total NMR porosity. A kerogen volume of the earth formation is estimated as a function of the gas filled porosity and a total organic carbon content of the earth formation. A bitumen filled total porosity is determined as a function of the estimated kerogen volume and the estimated total porosity of the earth formation. A corrected kerogen volume of the earth formation is determined as a function of the estimated kerogen volume and the estimated total porosity of the earth formation.

20 Claims, 5 Drawing Sheets

(58) Field of Classification Search
USPC .......................................................... 702/8
See application file for complete search history.

(56) References Cited

U.S. PATENT DOCUMENTS

| | | | |
|---|---|---|---|
| 6,147,489 | A | 11/2000 | Freedman et al. |
| 7,376,514 | B2 | 5/2008 | Habashy et al. |
| 8,573,298 | B2 | 11/2013 | Jacobi et al. |
| 2002/0008197 | A1 | 1/2002 | Mickael |
| 2004/0032257 | A1 | 2/2004 | Freedman |
| 2008/0006410 | A1 | 1/2008 | Looney et al. |
| 2010/0057409 | A1 | 3/2010 | Jones et al. |
| 2011/0068788 | A1 | 3/2011 | Minh |
| 2013/0047717 | A1 | 2/2013 | Gzara |
| 2014/0214324 | A1 | 7/2014 | Freedman et al. |
| 2015/0094960 | A1* | 4/2015 | Kadayam Viswanathan ............... E21B 49/00 702/13 |

OTHER PUBLICATIONS

International Search Report and Written Opinion issued in International Patent application PCT/US2016/057438, dated Jan. 6, 2017. 18 pages.
Passey et al., A Practical Model for Organic Richness from Porosity and Resistivity Logs, The American Association of Petroleum Geologists Bulletin, Dec. 12, 1990, vol. 74, No. 12, pp. 1777-1794.
Jarvie, Daniel M., Shale Resource Systems for Oil and Gas: Part 1—Shale-Gas Resource Systems, in J.A. Breyer, ed., Shale Reservoirs—Giant Resources for the 21st Century: AAPG Memoir. 2012, p. 69-87.
Chen, S., et al. Qualitative and Quantitative Information NMR Logging Delivers for Characterization of Unconventional Shale Plays: Case Studies, Transactions of the SPWLA 54th Annual logging Symposium, Jun. 22-26, 2013, p. 1-10.
Loucks et al., Spectrum of pore types and networks in mudrocks and a descriptive classification for matrix-related mudrock pores. AAPG Bulletin, Jun. 2012, v. 96, No. 6, pp. 1071-1098.
Passey et al., From Oil-Prone Source Rock to Gas-Producing Shale Reservoir—Geologic and Petrophysical Characterization of Unconventional Shale Gas Reservoirs. SPE paper 131350. Society of Petroleum Engineers, International Oil and Gas Conference and Exhibition in China, Jun. 8-10, Beijing, China.Jun. 8-10, 2010. 29 pages.
Radtke et al., A New Capture and Inelastic Spectroscopy Tool Takes Geochemical Logging to the Next Level, 53rd SPWLA Annual Logging Symposium, Cartagena, Columbia, Jun. 16-20, 2012, Paper AAA. 16 pages.
Freedman et al., New Method for Determining Mineralogy and Matrix Properties from Elemental Chemistry Measured by Gamma Ray Spectroscopy Logging Tools, SPE-170722-MS, SPE Annual Technical Conference and Exhibition, Oct. 27-29, 2014, Amsterdam, The Netherlands. 16 pages.
Freedman, R. et al., Combining NMR and Density Logs for Petrophysical Analysis in Gas-Bearing Formations, Trans. of the 39th SPWLA Annual Logging Symposium, May 26-29, 1998. paper II, pp. 1-14.
Herron et al., Wireline Source-Rock Evaluation in the Paris Basin, published in AAPG Special Volumes, Chapter 5. p. 57-71. 1990.
Anand et al., New Generation NMR Tool for Robust, Continuous T1 and T2 Measurements, SPWLA 56th Logging Symposium, Jul. 18-22, 2015, Long Beach, California, USA. 12 pages.
First Office Action and Search Report issued in Chinese Patent Application 20160068666.8 dated Jul. 29, 2019, 10 pages.
Abu-Shanab et al., Improved porosity estimation in tight gas reservoirs from NMR and density logs, SCA2005-57, International Symposium of the Society of Core Analysts, Aug. 2005, 6 pages.
Hamada et al., Better porosity estimate of gas sandstone reservoirs using density and NMR logging data, Emirates Journal for Engineering Research, 13 (3), 2008, pp. 47-54.
Chao, et al., Summary on well logging evaluation method of total organic carbon content in formation, Progress in Geophysics, 29(6), 2831-2837, 2014. Includes English Abstract.
International Preliminary Report on Patentability issued in International Patent application PCT/2016/057438, dated May 15, 2018, 13 pages.

* cited by examiner

METHOD FOR FORMATION EVALUATION OF ORGANIC SHALE RESERVOIRS USING WELL LOGGING DATA

CROSS-REFERENCE TO RELATED APPLICATIONS

This application claims the benefit and priority of previously filed provisional patent application, U.S. Ser. No. 62/254,524, filed Nov. 12, 2015, the contents of which are hereby incorporated by reference.

TECHNICAL FIELD

Disclosed herein is a formation evaluation method and workflow for determining formation parameters from borehole logging measurements made in organic rich mudstones, also called organic rich shales.

BACKGROUND INFORMATION

Formation evaluation of organic shale reservoirs involves the development of new methodologies. Many of the formation evaluation methods developed for conventional reservoirs are not valid in shale reservoirs and source rocks. It was not anticipated in the petroleum industry that very tight shale source rocks could also become commercially productive oil and gas reservoirs prior to the drilling and completion of a vertical well in the Barnett Shale in 1982 by Mitchell Energy & Development Company (MEDC). The MEDC well was drilled to explore the Barnett shale gas producing potential. Although the MEDC 1-Slay well found gas, that gas could not be produced at commercial rates. Subsequent wells including the MEDC-1 Sims, a horizontal well drilled in the Barnett Shale in 1991, also proved to produce gas at non-commercial flow rates. The work started by MEDC was continued and improved on by Devon Energy which bought MEDC in 2002. The breakthroughs made by Devon and others helped enable the shale oil and gas revolution that has swept through North America during recent years. These improvements, which have led to good commercial production rates, were chiefly made in the area of drilling and completion technology, e.g., multi-stage hydraulic fracturing of long horizontal wells.

The diminished role of well logging in North American shale resource plays (e.g., Eagle Ford, Barnett, Haynes, Bakken, and others) compared to its importance in conventional reservoirs was caused, in part, by the failure of standard well logging interpretation methods and logging tools to deliver reliable shale reservoir parameters. This led operators to pursue brute force approaches for making well completion decisions instead of relying on scientific based interpretations of well logging measurements.

Some of the formation parameters of interest to operators in organic shale plays are total organic carbon (TOC), level of organic maturity (LOM), porosity, kerogen volume, and fluid volumes. Considerable work was done on characterizing organic richness, e.g., TOC in organic-rich shale source rocks from well logs. The work on well log evaluation of source rocks predated the development and production from North American shale gas and oil reservoirs, i.e., it was done before the industry fully realized that the source rocks could also be reservoirs. One method proposed is known as the "Δ Log R method" which like other related methods uses the fact that in organic rich shales density and sonic log porosities read too high due to the presence of low density and low velocity solid organic matter most of which is kerogen. Organic rich shales can be differentiated from organic-lean shales by anomalously high gamma ray count rates that greatly exceed normal gamma ray readings from radioactive clays. If the sonic or density porosity log and a deep reading resistivity log are scaled to overlay one another in organic-lean shales then in organic-rich shales the two curves will separate. The separation can be related to TOC by calibration to lab measurements of TOC on conventional core or sidewall samples. The calibration to TOC depends on the level of maturity (LOM) which is not accurately known unless laboratory vitrinite reflectance measurements on core samples are available. Some of the problems with this method of predicting TOC are that it is user dependent and it also uses LOM that may not be accurately known.

Porosity is a very useful reservoir parameter in shale reservoirs because it represents the storage capacity and production potential for hydrocarbons. Natural fractures that often exist in thermogenic shale gas reservoirs (e.g., Barnett Shale) are generally cemented with calcite and may play little or no role in the production of hydrocarbons. Because shale reservoirs often have low porosities, e.g., in the 2-8 p.u. range, it is more helpful that shale porosity be accurately measured than say for a conventional reservoir with 30 p.u. porosity. Determining accurate porosity measurements from well logs in organic rich shales is difficult. As noted above, the presence of low density and low velocity organic matter causes density and sonic log derived porosities to read too high. Similarly thermal neutron porosities read too high, in part, because of the presence of hydrogen in the inter layers of clay minerals in the form of hydroxyl (OH) groups and can also be affected by the presence of strong thermal neutron absorbing nuclei such as boron. The NMR logging tool porosity is frequently used as the estimate of the rock porosity because it sees the fluids and it is not affected by kerogen. NMR porosity reads too low if some of the fluid in the pore space is gas (or light oil) that has a low hydrogen index compared to that of water.

The determination of fluid types (water, oil, and gas) and fluid volumes is another useful part of the formation evaluation of organic shale reservoirs and source rocks. In immature organic rich source rocks the pore space is filled with brine and the porosity is the interstitial spaces between the mineral grains. Organic matter from plant and animal remains was deposited in oceans, lakes, and swamps at the same time as the inorganic sediments and buried and exposed to bacteria, high temperatures, and pressures over millions of years. This organic matter is eventually transformed into kerogen—a solid organic substance rich in carbon and hydrogen which is the primary feedstock for conventional as well as for non-conventional petroleum reservoirs. In mature source rocks that have been exposed to sufficient temperature and pressure during their burial history the kerogen is first transformed into bitumen then oil and then to gas with increasing temperature. If the source rock retains the hydrocarbons it is also a petroleum reservoir.

Depending on the level of maturity of organic rich shale the pore spaces can contain either: (1) water (2) water and oil, (3) water, oil, and gas or (4) water and gas. Depending on the gas composition and the pressure and temperature the gas composition can vary from dry gas (e.g., methane) to wet gas or be present as a liquid phase gas condensate. The volume and weight percent of kerogen in the shale decreases and its chemical composition changes (e.g., the ratio of hydrogen to carbon atoms decreases) as the maturity of the resource increases, however, thermally degraded kerogen is still present in mature shale oil and gas reservoirs. A second porosity system develops within the kerogen during the thermogenic transformation to hydrocarbons. As hydrocarbons are formed the kerogen becomes filled with pores. These surfaces of these pores are believed to be hydrocarbon wet and under the right conditions gas can condense onto the pore surfaces. This secondary porosity system is sometimes referred to as organic porosity whereas the interstitial porosity is sometimes referred to as inorganic porosity. The total shale porosity is the sum of the inorganic and the organic porosity and it is the storage capacity for fluids and gas.

Fluid typing and fluid volume determination using NMR diffusion measurements which is done in conventional reservoirs to differentiate between water, oil, and gas is generally not performed in shales because the very small pore sizes restrict the molecular diffusion and cause fast T2 relaxation rates which reduce the NMR sensitivity to molecular diffusion. NMR relaxation time distributions can be influenced by various factors (e.g., internal magnetic field gradients and magnetic minerals) which can undermine the reliability of interpretations based on relaxation times in shales. It is also known from laboratory experiments that the water and hydrocarbon NMR relaxation time distributions in shale rocks are overlapping. This means that NMR relaxation time distributions cannot be used to compute reliable water and hydrocarbon volumes. The determination of water saturation from resistivity and porosity, as is done in conventional rocks, using Archie's equation or other empirical saturation equations may not be valid in shale reservoirs because of the very small pore sizes and complex mineralogy. In particular, large surface to volume ratios of the small pores in shale reservoirs can lead to very large surface conductance effects. Moreover, the presence of conductive pyrite in organic rich shale reservoirs on rock conductivities is not accounted for in the saturation equations. Other methods involve use of existing expert systems.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Disclosed herein is a method including estimating a total porosity of an earth formation as a function of bulk density and total nuclear magnetic resonance (NMR) porosity of the earth formation, using a processor, wherein the total porosity of the earth formation as estimated underrepresents bitumen content of the earth formation. The method also includes estimating a gas filled porosity of the earth formation as a function of the bulk density and the total NMR porosity, using the processor, as well as estimating a kerogen volume of the earth formation as a function of the gas filled porosity and a total organic carbon content of the earth formation, using the processor. A bitumen filled total porosity of the earth formation is determined as a function of the estimated kerogen volume and the estimated total porosity of the earth formation, using the processor. A corrected kerogen volume of the earth formation is determined as a function of the estimated kerogen volume and the estimated total porosity of the earth formation, using the processor.

Also disclosed herein is a system having at least one well logging tool to acquire formation bulk density data, nuclear magnetic resonance (NMR) porosity data, and organic carbon content data from an earth formation. The system also includes a processor cooperating with the at least one well logging tool. The processor is to determine a bulk density of the earth formation from the formation bulk density data, determine a total NMR porosity of the earth formation from the NMR porosity data, and determine a total organic carbon content of the earth formation from the total organic content data. The processor is also to estimate a gas filled porosity of the earth formation as a function of the bulk density and the total NMR porosity, estimate a kerogen volume of the earth formation as a function of the gas filled porosity and the total organic carbon content of the earth formation, determine a bitumen filled total porosity of the earth formation as a function of the estimated kerogen volume and an estimated total porosity of the earth formation, and determine a corrected kerogen volume of the earth formation as a function of the estimated kerogen volume and the estimated total porosity of the earth formation.

Also disclosed herein is a method including estimating a gas filled porosity of an earth formation as a function of bulk density and total NMR porosity of the earth formation, using a processor, and estimating a kerogen volume of the earth formation as a function of the gas filled porosity, using the processor. The method further includes determining a bitumen filled total porosity of the earth formation as a function of the estimated kerogen volume and an estimated total porosity of the earth formation, using the processor, and determining a corrected kerogen volume of the earth formation as a function of the estimated kerogen volume and the estimated total porosity of the earth formation, using the processor.

DETAILED DESCRIPTION

One or more specific embodiments are described below. These embodiments are but examples of the presently disclosed techniques. Additionally, in an effort to provide a concise description of these embodiments, some features of an actual implementation may not be described in the specification. It should be appreciated that in the development of any such implementation, as in any engineering or design project, numerous implementation-specific decisions are made to achieve the developers' specific goals, such as compliance with system-related and business-related constraints, which may vary from one implementation to another. Moreover, it should be appreciated that such development efforts might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. The embodiments discussed below are intended to be examples that are illustrative in nature and should not be construed to mean that the specific embodiments described herein are necessarily preferential in nature. Additionally, it should be understood that references to "one embodiment" or "an embodiment" within the present disclosure are not to be interpreted as excluding the existence of additional embodiments that also incorporate the recited features.

Figure 6A:
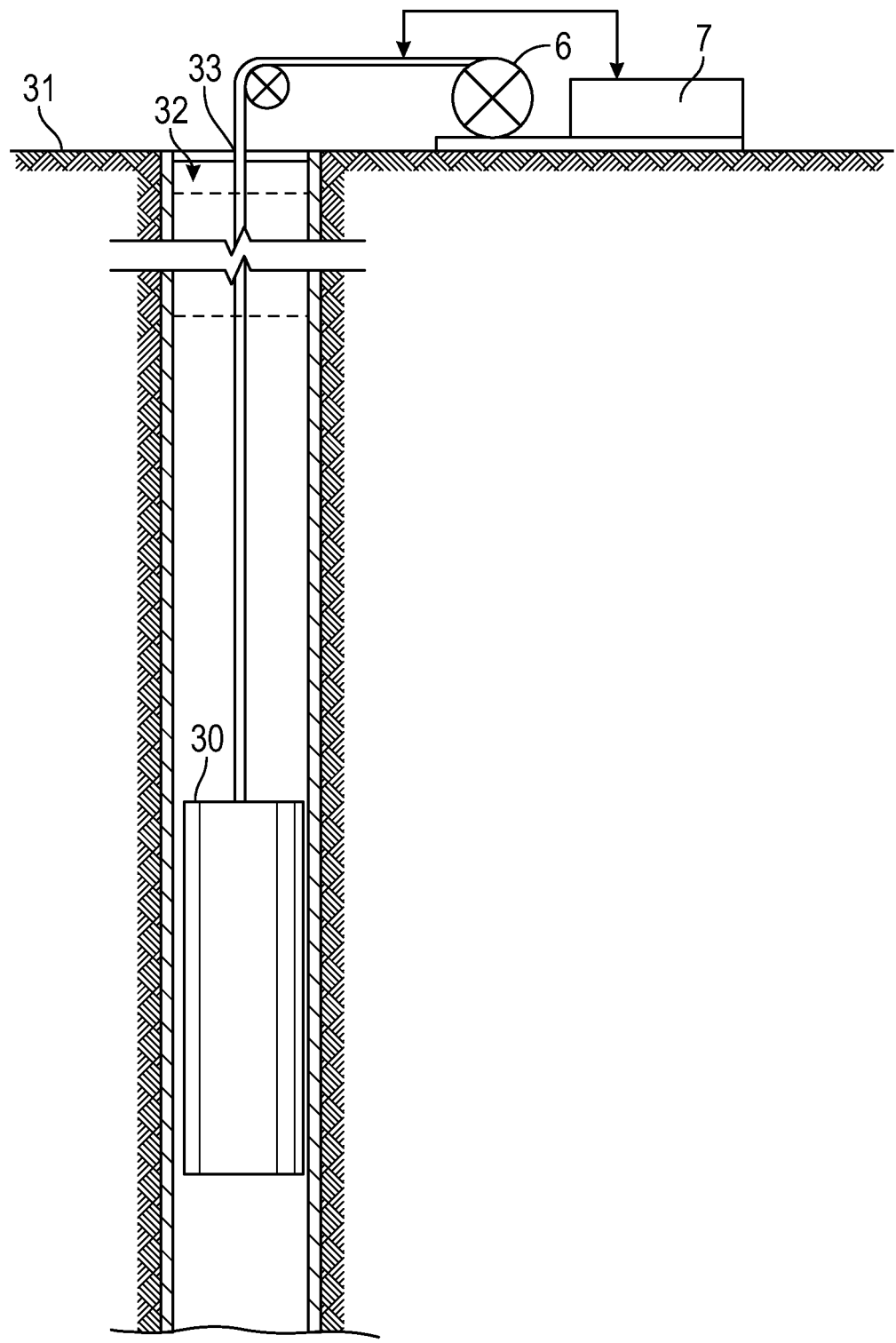
FIG. 6A is a schematic diagram of a subterranean wireline well logging system.
Figure 6B:
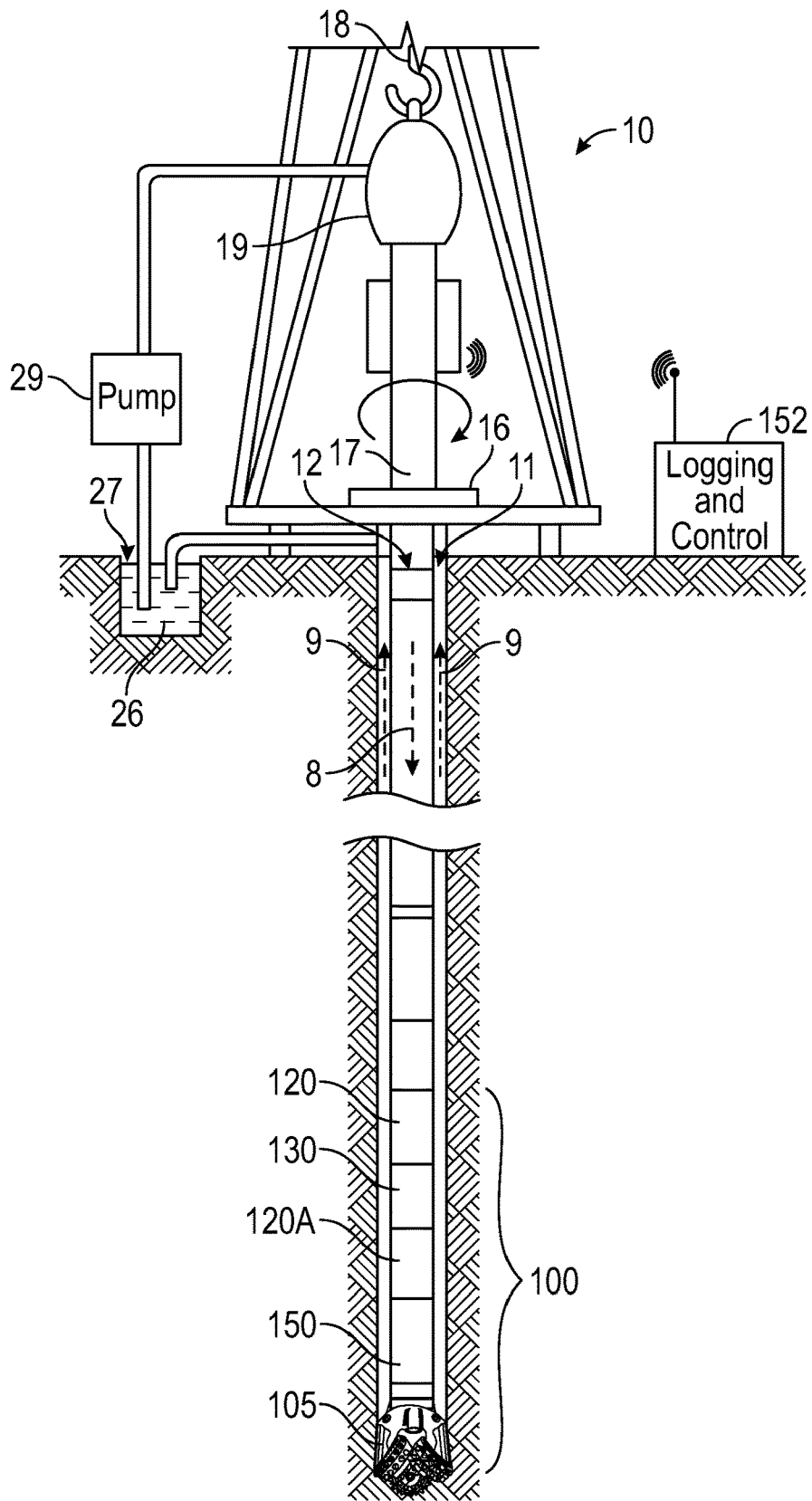
FIG. 6B is a schematic diagram of a subterranean logging-while-drilling and/or measurement-while-drilling well logging system.

To provide some general background with respect to the field of well logging and formation evaluation, FIGS. 6A and 6B illustrate different types of well site systems, which can be deployed onshore or offshore. Specifically, FIG. 6A illustrates a wireline system for investigating earth formations. As shown, the system includes a nuclear magnetic resonance (NMR) logging device 30 for investigating earth formations 31 traversed by a borehole 32. The NMR logging device 30 is suspended in the borehole 32 on an armored cable 33 (e.g., a wireline cable), the length of which substantially determines the relative axial depth of the device 30. As can be appreciated, the cable length is controlled by suitable means at the surface such as a drum and winch mechanism 6. Surface equipment 7 can be of known types and can include a processor-based system which communicates with downhole equipment including NMR logging device 30. The NMR logging device 30 may include a permanent magnet or magnet array that produces a static magnetic field in the formations, and one or more radio frequency (RF) antenna for producing pulses of magnetic field in the formations and for receiving the spin echoes from the formations. A variety of downhole NMR logging tools are known in the art, including the type disclosed in U.S. Pat. No. 4,710,713.

FIG. 6B shows another example of another type of well site system for logging-while-drilling (LWD) and/or measurement-while-drilling (MWD) applications. Here, a borehole 11 is formed in subsurface formations by rotary drilling in a manner that is well known. Some embodiments can also use directional drilling. As shown, a drill string 12 is suspended within the borehole 11 and has a bottom hole assembly (BHA) 100 which includes a drill bit 105 at its lower end. The surface system includes platform and derrick assembly 10 positioned over the borehole 11, with the assembly 10 including a rotary table 16, kelly 17, hook 18 and rotary swivel 19. In operation, the drill string 12 is rotated by the rotary table 16, energized by means not shown, which engages the kelly 17 at the upper end of the drill string. The drill string 12 is suspended from a hook 18, attached to a traveling block (also not shown), through the kelly 17 and a rotary swivel 19 which permits rotation of the drill string relative to the hook. As is well known, a top drive system could alternatively be used.

In this example embodiment, the surface system further includes drilling fluid or mud 26 stored in a pit 27 formed at the well site. A pump 29 delivers the drilling fluid 26 to the interior of the drill string 12 via a port in the swivel 19, causing the drilling fluid to flow downwardly through the drill string 12 as indicated by the directional arrow 8. The drilling fluid exits the drill string 12 via ports in the drill bit 105, and then circulates upwardly through the annulus region between the outside of the drill string and the wall of the borehole, as indicated by the directional arrows 9. In this manner, the drilling fluid lubricates the drill bit 105 and carries formation cuttings up to the surface as it is returned to the pit 27 for recirculation.

The BHA 100 of the illustrated embodiment includes a logging-while-drilling (LWD) module 120, a measuring-while-drilling (MWD) module 130, a rotary-steerable system and motor 150, and drill bit 105. The LWD module 120 may be housed in a special type of drill collar, as is known in the art, and can contain one or more types of logging tools. It will also be understood that more than one LWD and/or MWD module can be employed, as represented at 120A. The LWD module includes capabilities for measuring, processing, and storing information, as well as for communicating with the surface equipment. In the present embodiment, the LWD module includes a NMR measuring device.

The MWD module 130 is likewise housed in a special type of drill collar, as is known in the art, and can contain one or more devices for measuring characteristics of the drill string and drill bit. The MWD tool further includes an apparatus (not shown) for generating electrical power to the downhole system. This may include a mud turbine generator powered by the flow of the drilling fluid 26, although other power and/or battery systems may also be employed. By way of example, the MWD module 130 may include one or more of the following types of measuring devices: a weight-on-bit measuring device, a torque measuring device, a vibration measuring device, a shock measuring device, a stick/slip measuring device, a direction measuring device, and an inclination measuring device. The operation of the assembly 10 of FIG. 6B may be controlled using the logging and control system 152, which may include one or more processor-based computing systems.

In the present context, a processor may include a microprocessor, PLC, FPGA, ASIC, SOC, or any other suitable integrated circuit capable of executing encoded instructions stored, for example, on tangible computer-readable media. When loaded and executing the encoded instructions from the tangible computer-readable media, the various transistors of the processor are specifically configured to perform those instructions in that the biasing of those transistors is different than it was prior to loaded and executing the encoded instructions. As the biasing of a transistor changes, the locations and concentrations of physical charge carrying particles such as electrons within the transistor change. Thus, the loading and executing of the encoded instructions actually changes the physical structure of the transistors of the processor, rendering the processor as being physically and electrically configured as a special purpose machine. The control system 152 may be local to the wellsite, or may be remotely located.

As will be explained in greater detail below, disclosed herein is a formation evaluation method and workflow for determining formation parameters from borehole logging measurements made in organic rich mudstones also called organic rich shales. The formation parameters derived from the method include continuous depth logs of total porosity corrected for kerogen and fluid effects, the volume fraction of kerogen, and the fluid filled porosities. This information is a measure of the organic richness and level of maturity of the shale resource and it is used by operators to select those intervals which are most likely to be oil or gas productive after stimulation by hydraulic fracturing. Additionally, byproducts of the workflow are the weight fractions of the minerals in the shale and the matrix density. The mineralogy information is valuable input into the assessment of the "brittleness" of the rock and the likelihood that the hydraulic fracturing stimulation may create a network of connected fractures extending far into the formation which is used for high commercial production rates from organic shale reservoirs with extremely low permeability (i.e., microdarcy to nanodarcy range).

Figure 1:
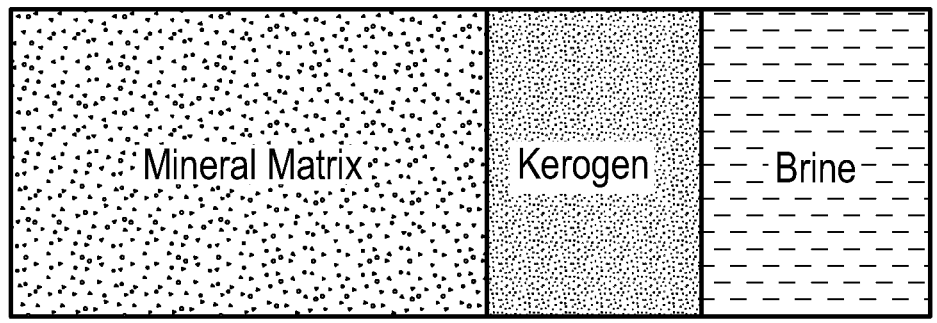
FIG. 1 illustrates a model for an immature organic shale source rock.
Figure 2:
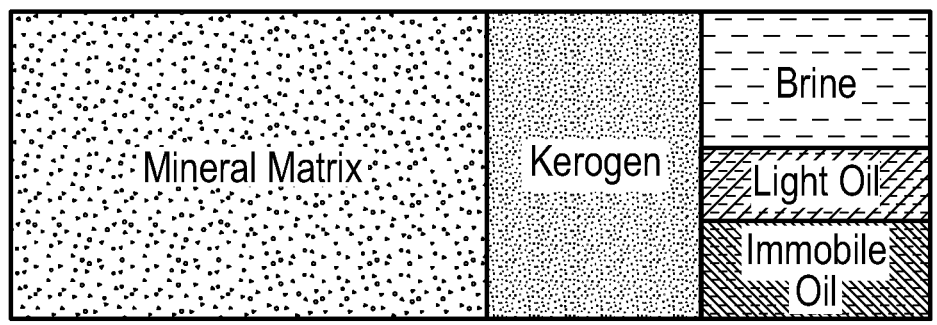
FIG. 2 illustrates a model for a mature organic shale oil reservoir rock.
Figure 3:
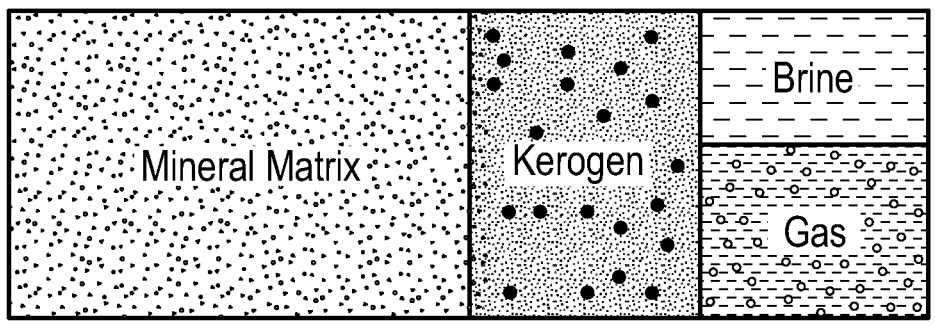
FIG. 3 is a model for a mature organic shale gas reservoir rock showing organic porosity in kerogen.

In addition, a method for the formation evaluation of organic shale gas reservoirs, shale oil reservoirs, and immature shale source rocks is disclosed. The method starts with a model for the composition of shale rocks. In FIGS. 1, 2, and 3 are shown models appropriate for immature organic source rocks, mature organic shale oil reservoirs, and mature organic shale gas reservoirs. Immature organic source rocks in the early stages of their burial contain organic matter which after deeper burial and exposure to increased pressures and temperatures is eventually transformed into a solid insoluble organic material called kerogen. As the organic shale is buried deeper and exposed to increasing pressures and temperatures over millions of years the kerogen matures and is transformed into hydrocarbons as shown in FIGS. 1, 2, and 3.

Important petrophysical properties of shale reservoirs, e.g., total porosity, kerogen volume, and oil, gas, and water volumes and saturations are systematically determined from suites of measurements which include density, NMR, dielectric, and neutron induced gamma ray spectroscopy logging tools. In organic shale gas and oil reservoirs whose maturities are known to be very mature such that bitumen and non-producible oil are not present in the reservoir then a reduced suite of three measurements, i.e., density, NMR, and geochemical logging data can be used to determine total porosity, kerogen volume, and water and gas (or light oil) volumes. The total porosity is corrected for fluid effects on both the NMR and bulk density logs and for the effects of kerogen on the bulk density log response.

A spectroscopy or geochemical logging tool is used to determine total organic carbon (TOC), mineralogy, and the density of the mineral matrix. The dielectric tool can be used to provide water-filled porosity.

The methods, techniques, systems, and workflows referred to above will now be described in greater detail. Density logging tools were first introduced into the industry in the 1960s. Since that time the technology has evolved with improvements in electronics and gamma ray scintillation detectors as well as in tool design. The main purpose of a density logging tool is to measure the bulk density in units of g/cm$^3$ of the earth formations adjacent to the wellbore and to provide a log or record of the bulk density versus depth in the logged interval.

During a density tool logging operation a radioactive gamma ray source, such as $^{137}$Cs is used to produce gamma ray radiation which propagates in the earth formation adjacent to the borehole. The gamma ray flux is attenuated by a process called Compton scattering a process whereby the gamma rays interact with the electron density and lose some of their energy. The logarithm of the total gamma ray count rate measured at the detector is related to the distance of the detector from the source and bulk density after some corrections are made for hydrogen which has a ratio of proton number to atomic number (Z/A) which is unity and deviates from the Z/A values that are close to 0.5 for most of the other elements in sedimentary rocks. In practice, both long and short-spaced detectors are used to compensate for the effects of a mud cake layer that can separate the density tool pad or drill collar that contains the chemical source and the detectors from the formation. In the future there may be density logging tools that do not use chemical sources and there may be other designs for density logging tools that differ from the design discussed here. It is understood that the workflows and techniques disclosed herein are independent of the specific apparatus and details related to how the bulk density of the formation is measured and how the density tool is conveyed into the borehole.

If we include the effects of the fluids, (e.g., bitumen and/or non-producible oil, light oil, gas, and brine) and kerogen that can be present in organic shales we first write a general equation for the bulk density ($\rho$) measured by a formation density logging tool in an organic rich shale gas reservoir, $$\rho_b = (1-\phi-V_k)\rho_{ma} + \rho_k V_k + \rho_f \phi(1-S_g) + \rho_g \phi_g. \quad (1)$$

In equation (1), $\phi$ is the total fluid-filled porosity of the organic shale, $V_k$ is the volume fraction of kerogen, $S_g$ is the gas saturation, $\phi_g$ is the gas-filled porosity, and $\rho_{ma}$, $\rho_k$, $\rho_f$, $\rho_g$ are mass densities of the mineral matrix, kerogen, fluid, and gas. In the case of a shale gas reservoir the fluid in equation (1) may be brine and possibly adsorbed gas in organic matter pores depending on the specific reservoir conditions. In some shale gas reservoirs the fluid might include immobile oil depending on the thermal maturity of the reservoir. Note that equation (1) as written here is appropriate for a shale gas reservoir (e.g., Barnett Shale) that produces either mostly or predominantly dry or wet gas. It is to be understood that for a shale oil reservoir that produces mostly or predominantly light oil (e.g., Bakken Shale) one would replace $S_g$, $\rho_g$, $\phi_g$ by $S_o$, $\rho_o$, $\phi_o$ in equation (1) where $S_o$, $\rho_o$, $\phi_o$ are the oil saturation, oil density, and oil-filled porosity, respectively of the light or producible oil. In the case of a shale oil reservoir the fluid in equation (1) refers to brine, bitumen, and other non-producible oil.

Pulsed Nuclear Magnetic Resonance (NMR) logging tools were first introduced in the early 1990s. These tools operate in a frequency range from roughly a few hundred kilohertz to about 2 megahertz. The tools have a strong permanent magnet that polarizes or aligns the magnetic moments of hydrogen nuclei in the rock formations adjacent to the borehole. Then a set of radio frequency (RF) pulses is applied by an antenna. The RF pulses rotate the hydrogen nuclei into a plane perpendicular to the static magnetic field and manipulate the resulting transverse magnetization which rotates and induces a decaying sinusoidal voltage in the antenna. The Carr-Purcell-Meiboom-Gill spin-echo technique is used to create and manipulate the transverse magnetization so that a sequence of spin-echo signals whose envelope decays exponentially with a distribution of transverse relaxation decay times (T2) are acquired in the shale. The amplitude of the measured signal at time zero is equal to the total porosity ($\phi_{nmr}$) of the formation. Some NMR tools do not measure hydrogen nuclei in solids (like kerogen) because the decay times are too short to be detected, and measure hydrogen nuclei in liquids and gases. Some NMR tools, however, may measure hydrogen nuclei in solids, such as kerogen, as well.

The equation for the total NMR porosity ($\phi_{nmr}$) measured by an NMR logging tool is lithology independent and can be written in a shale gas reservoir as, $$\phi_{nmr} = \phi_g HI_g + \phi(1-S_g)HI_f. \quad (2)$$

Some NMR logging tools do not respond to the hydrogen nuclei in the solid kerogen which relax too fast to be detected. If a NMR tool capable of detecting kerogen is used, an additional term accounting for the kerogen response can be added to equation (2). In equation (2), $HI_g$ and $HI_f$ are the hydrogen indices of the gas and fluid, respectively.

As noted above in the case of shale gas reservoirs the fluid includes brine and possibly immobile oil and adsorbed gas depending on the specific reservoir. Equation (2) assumes that the hydrogen nuclei in the shale are sufficiently polarized by the applied static magnetic field. If this is not the case a polarization correction can be applied in equation (2). The hydrogen index of the gas as well as that of gas condensate that might be present in the organic porosity depends on the gas composition, and the reservoir temperature and pressure. The hydrogen indices of the oil and brine are close to unity. As discussed above, for a shale oil reservoir the light oil (i.e., producible oil) may replace the gas in equation (2) so that $S_g$, $\rho_g$, $\phi_g$ would be replaced by $S_o$, $\rho_o$, $\phi_o$.

The total shale porosity ($\phi$) in equations (1) and (2) includes the intergranular porosity (spaces between mineral grains), intra-mineral porosity, and the organic porosity associated with "holes in the kerogen" that are created during the transformation of kerogen to hydrocarbons (as described in Loucks et al. 2012, AAPG Bulletin, v. 96, no. 6, pp. 1071-1098).

The NMR measurement in equation (2) is a "total NMR porosity" (the generation of which is described in U.S. Pat. No. 6,147,489, the contents of which are hereby incorporated by reference). Total NMR porosity measurements, depending on the signal-to-noise, echo spacing, and pulse sequence, can be sensitive to relaxation times as short as 1 millisecond so that the NMR porosity includes most clay bound water porosity. The relaxation times of condensed gas in the organic pores depend on the wettability of the pores, the surface to volume ratios of the pores and the surface relaxivities of the pore surfaces in the kerogen. As the kerogen matures its organic matter is first transformed to bitumen. As the level of maturity of the kerogen increases the large bitumen molecules are by thermogenic processes, gradually transformed into producible or light oil, wet gas and finally dry gas. The volume and viscosity of bitumen remaining in an organic shale reservoir depends on the thermal maturity of the reservoir. For example, very mature shale gas reservoirs producing dry gas are often found to contain negligible volumes of bitumen. This has been verified in laboratory shale gas core samples from which negligible bitumen was found following bitumen extraction using organic solvents.

Bitumen is a viscous hydrocarbon comprised of a mixture of large hydrocarbon molecules (e.g., asphaltenes and resins) and it has a chemical composition somewhat similar to kerogen but there are differences. For example, bitumen is soluble in organic solvents whereas kerogen is insoluble in organic solvents. It can have a wide range of T2 relaxation times spanning a large range. Some of the bitumen T2 times are below the T2 sensitivity limit of modern NMR logging tools and therefore the NMR total porosity in equation (2) can underestimate the total shale porosity depending on how much of the pore space is occupied by bitumen below the sensitivity limit.

A measure of the level of maturity of the organic rich shale is the vitrinite reflection coefficient ($R_o$ %) which is a standard measurement made on organic shale samples in the laboratory. It can be correlated with the maximum temperature that the sample has been exposed to during its burial history and therefore it is used as a measure of the maturity of the organic rich shale. For example, for low maturity organic shales which have not produced hydrocarbons $R_o$ values are in the range from approximately $R_o=0.2\%$ to $R_o=0.38\%$ depending on the type of kerogen. Bitumen production starts approximately above $R_o=0.38\%$. The oil generation window is from about $R_o=0.5\%$ to $R_o=1.1\%$. Above $R_o=1.1\%$ the organic rich shale is prone to gas production (as shown in Passey et al. 2010, SPE paper 131350).

The next step is to solve equations (1) and (2) for total porosity ($\phi$) and gas-filled porosity ($\phi_g$). One finds after some simple algebra that, $$\phi = \frac{\left(1 - \frac{HI_g}{HI_f}\right)DPHI + \lambda \frac{\phi_{nmr}}{HI_f} - \left(1 - \frac{HI_g}{HI_f}\right)\lambda_2 V_k}{\left(1 - \frac{HI_g}{HI_f}\right) + \lambda}, \qquad (3)$$

and, $$\phi_g = \frac{DPHI - \frac{\phi_{nmr}}{HI_f} - \lambda_2 V_k}{\left(1 - \frac{HI_g}{HI_f}\right) + \lambda}. \qquad (4)$$

In equations (3) and (4) the density log porosity (DPHI) is defined as, $$DPHI = \frac{\rho_b - \rho_{ma}}{\rho_f - \rho_{ma}}, \qquad (5)$$

and the two parameters $\lambda$ and $\lambda_2$, $$\lambda = \frac{\rho_f - \rho_g}{\rho_{ma} - \rho_f}, \qquad (6)$$

$$\lambda_2 = \frac{\rho_{ma} - \rho_k}{\rho_{ma} - \rho_f}. \qquad (7)$$

The dry mineral matrix density ($\rho_{ma}$) in equations (5)-(7) can have a wide range of values (e.g., ~1.6 to 3.0 g/cm³) in complex reservoirs which can vary over relatively short (e.g., a few inches) depth intervals in shale reservoirs depending on the detailed mineralogical composition of the shale. As discussed below depth logs of $\rho_{ma}$ and mineral weight fractions are determined from processing measurements acquired by a neutron-induced gamma ray spectroscopy logging tool. The density of kerogen is less than the density of the mineral matrix and it has a much narrower range, e.g., it is in the range from about 1.1 to 1.4 g/cm³ depending on the maturity of the kerogen. This means that a small weight fraction of kerogen can occupy a much larger (e.g., a factor of 2) volume fraction in an organic shale rock. The value of $\rho_f$ in equations (5)-(7) depends on the immobile oil or adsorbed condensate gravity, the salinity of the brine, and the relative amounts of water and liquid phase hydrocarbon in the pore space. The standard practice for computing density log porosities is to use a value of $\rho_f=1.0$ g/cm³ in the above equations.

Equations (3)-(8) are for shale gas reservoirs for which the light hydrocarbon produced is gas. In the case of a shale oil reservoirs where the light hydrocarbon produced is light oil (e.g., shale reservoirs produce low density oils having 40 API and higher gravities) the equations remain valid if $H_g$, $\phi_g$, $\rho_g$ are replaced by $H_o$, $\phi_o$, $\rho_o$ the hydrogen index, oil-filled porosity, and density of the light oil. In the case of a shale oil reservoir the other fluids that can be in the pore spaces in addition to brine are bitumen and non-producible oil. The total organic shale gas reservoir porosity computed by equation (3) is a weighted sum of the density porosity (with corrections for the effects of kerogen and light hydrocarbons) and the NMR porosity corrected for light hydrocarbons. The effect on the total porosity if the NMR measurement undercalls the bitumen porosity is lessened by the fact that the total porosity is computed from the weighted sum in (3). Missing bitumen porosity, however, can cause overestimates of gas volumes, saturations, and kerogen volumes. The missing bitumen porosity can be computed by a post-processing iterative scheme disclosed below in this disclosure.

Neutron spectroscopy logging tools that measure the elemental chemistry of earth formations adjacent to the borehole first were introduced in the 1980s. These tools are also called "geochemical logging tools" because they measure the chemical elemental composition (e.g., the weight percent of Si, Ca, Fe, Al, C, and other elements) in rock formations and reservoirs. Since their introduction in the 1980s there have been many advances in neutron generator, electronics, and gamma ray detector technologies.

The methods and apparatus disclosed here makes use of a new high performance geochemical tool (for details see Radtke 2012 "A New Capture and Inelastic Spectroscopy Tool Takes Geochemical Logging to the Next Level" Proc., 53$^{rd}$ SPWLA Annual Logging Symposium, Cartagena, Columbia, 16-20 June, Paper AAA, the contents of which are hereby incorporated by reference). During operation a logging operation neutrons are generated by a very high flux deuterium-tritium neutron generator that produces 14-MeV neutrons which interact with the nuclei in the formation. Most of the neutrons in the formation rapidly reach thermal energies and are captured by the nuclei. Other fast neutrons scatter from the nuclei leaving the target nucleus excited. The nuclei which capture neutrons emit capture gamma rays with an energy spectrum that is characteristic of the element. The nuclei which are excited by inelastic scattering emit inelastic gamma rays. A scintillation detector with a fast recovery time measures the high count rates of both types of gamma rays. The measured gamma ray spectra are fitted to a set of standard spectra for the different elements to determine the elemental weight fractions. The carbon (C) weight fraction is determined solely from the measured inelastic spectra.

TOC, matrix density, and detailed mineral composition can be determined from measurements of elemental chemistry made by a neutron-induced gamma ray spectroscopy tool (as described in Radtke et al. 2012, "A New Capture and Inelastic Spectroscopy Tool Takes Geochemical Logging to the Next Level" Proc., 53$^{rd}$ SPWLA Annual Logging Symposium, Cartagena, Columbia, 16-20 June, Paper AAA; Freedman R. et al. 2014, "New Method for Determining Mineralogy and Matrix Properties from Elemental Chemistry Measured by Gamma Ray Spectroscopy Logging Tools" SPE-170722-MS paper presented at the SPE Annual Technical Conference and Exhibition, 27-29 October, The Netherlands; and US Pat. Pub. 2014/0214324. The contents of these references are hereby incorporated by reference). For example, detailed mineralogy logs including weight fractions of 14 minerals (e.g., illite, smectite, kaolinite, chlorite, quartz, calcite, dolomite, ankerite, plagioclase, orthoclase, mica, pyrite, siderite, and anhydrite) and logs of the mineral matrix ($\rho_{ma}$) can be determined from logs of elemental weight fractions of Si, Ca, Mg, Al, K, Fe, S, and Mn measured by the spectroscopy tool. The measurement of the total weight percent of carbon (C), in the shale formation, by measurement of gamma rays from inelastically scattered neutrons is used to compute logs of the weight percent of total organic carbon (TOC). TOC is determined from the total weight percent of C by subtracting the total weight percent of inorganic carbon in the minerals containing carbon (e.g. calcite, dolomite, and ankerite). TOC is a measure of the organic shale richness; however, it is not solely an indicator of the presence of producible hydrocarbons which uses information on the maturity of the shale.

Kerogen is lighter than the mineral matrix and therefore it causes the density log porosities to read too high. Gas and light oils can also cause the density log porosities to read too high. Similarly gas and light oil have low hydrogen indices compared to water and therefore cause the NMR porosities to read too low. The total organic shale porosity derived in equation (3) is corrected for the effects of the kerogen on the density log porosity (DPHI) and for the effects of the fluids and gas on both the NMR and density log porosities.

If we divide equation (4) by (3) we find an equation for the shale reservoir gas saturation ($S_g$). One finds that, $$S_g = \frac{DPHI - \frac{\phi_{nmr}}{HI_f} - \lambda_2 V_k}{\left(1 - \frac{HI_g}{HI_f}\right)DPHI + \lambda\frac{\phi_{nmr}}{HI_f} - \lambda_2\left(1 - \frac{HI_g}{HI_f}\right)V_k}. \qquad (8)$$

The factor $\lambda_2 V_k$ in equations (3), (4) and (8) provides a kerogen correction to the density log porosity, e.g., one can define kerogen corrected density log porosity, $$DPHI(K) = DPHI - \lambda_2 V_k. \qquad (9)$$

Substituting equation (9) into equations (3), (4), and (8) we find that these equations have the same form as the density-magnetic resonance gas equations derived for conventional gas-bearing reservoirs (as described in Freedman, R. et al. 1998, Combining NMR and Density Logs for Petrophysical Analysis in Gas-Bearing Formations, Trans. of the 39$^{th}$ SPWLA Annual Logging Symposium, 26-29, paper II, 1-14, the contents of which are hereby incorporated by reference). If there is no kerogen in the rock, for example as in a conventional reservoir, then equations (3), (4), and (8) remain valid and reduce to equations (5), (7), and (6) respectively in the Freedman et al. (1998) paper.

The above analysis has derived equations (3), (4), and (8) for the total formation porosity, gas-filled porosity, and gas saturation, respectively for a shale gas reservoir. These equations are the first step in the shale formation evaluation workflow. These equations each contain the volume of kerogen which remains to be determined.

The weight percent of total organic carbon (TOC) in the organic shale is used to determine the weight percent of kerogen. As noted above, TOC can be determined from the weight percent of carbon measured by a neutron spectroscopy tool (Radtke, et al., 2012) which measures gamma ray spectra from both thermal neutron capture and inelastic scattering. The weight percent of total carbon is determined from the gamma rays emitted from nuclei excited by inelastic neutron scattering. A borehole correction is made for carbon measured in the borehole (e.g., when oil base drilling muds or hydrocarbon additives are used during drilling). The mineralogy can be determined from the full spectra and used to determine the total inorganic carbon weight percent, for example, the weight percent of carbon in calcite, dolomite, siderite, and the other carbon bearing minerals that are present in the shale. TOC is determined by subtracting the inorganic carbon weight percent from the borehole corrected total carbon weight percent.

An equation that relates the weight fraction of the dry weight TOC measured by neutron spectroscopy to the volume fractions of kerogen and hydrocarbons in a shale gas reservoir is given by, $$TOC = \frac{c_k \rho_k V_k + c_o \rho_o \phi_o + c_g \rho_g \phi_g}{\rho_{ma} V_{ma}}. \quad (10)$$

In equation (10) the coefficients $c_k$, $c_o$, and $c_g$ are the weight fractions of carbon in kerogen, non-producible hydrocarbon fluids, and producible wet or dry gas, respectively. In a shale oil reservoir one can write equation (10) in the form, $$TOC = \frac{c_k \rho_k V_k + c_{o,im} \rho_{o,im} \phi_{o,im} + c_o \rho_o \phi_o}{\rho_{ma} V_{ma}}, \quad (11)$$

where $c_o$ and $c_{o,im}$ are the weight fractions of carbon in the light oil and in non-producible (immobile) oil, respectively. We note again that the definition of TOC in equations (10) and (11) is the dry weight TOC from a neutron spectroscopy tool. This definition differs from the TOC that is customarily defined in laboratory measurements. In the latter case the mass of the dry mineral matrix in the denominators in (10) and (11) is replaced by the total mass or bulk density of the sample. In equations (10) and (11) $V_{ma}$ is the volume of dry mineral matrix and is given by, $$V_{ma} = 1 - \phi - V_k. \quad (12)$$

Note that in immature organic shale source rocks just the first term on the right hand side of equations (10) and (11) contributes to TOC. The weight fraction of carbon in kerogen depends on the maturity level of the kerogen. A reasonable value to use in equation (10) is $c_k \approx 0.8$. The weight fraction of carbon in an average crude oil and typical gas has similar values and one can assume that $c_o \approx c_{o,im} \approx 0.84$ and $c_g \approx 0.75$ for dry gas. A gas condensate or a wet gas can have a carbon weight fraction closer to 0.8 so a reasonable approximation in equation (10) would be to set the coefficients equal to 0.8. The next step is to solve equation (10) for $V_k$ and one finds that, $$V_k = A + B\phi. \quad (13)$$

The coefficients in equation (13) are defined as follows, $$A = \frac{\rho_{ma} \cdot TOC + \phi_g(0) \cdot (c_o \rho_o - c_g \rho_g) + c_o \rho_o \phi_w}{\rho_{ma} \cdot TOC - a(c_o \rho_o - c_g \rho_g) + c_k \rho_k}, \quad (14)$$

and, $$B = -\frac{\rho_{ma} \cdot TOC + c_o \rho_o}{\rho_{ma} \cdot TOC - a(c_o \rho_o - c_g \rho_g) + c_k \rho_k}. \quad (15)$$

In deriving equations (13)-(15) we have made use of the constraint condition, $$\phi = \phi_w + \phi_o + \phi_g, \quad (16)$$

to mathematically remove the immobile oil volume $\phi_o$. In a shale oil reservoir we write the constraint in (16) as, $$\phi = \phi_w + \phi_{o,im} + \phi_o, \quad (17)$$

using different notation to differentiate the producible light oil volume $\phi_o$ from the immobile oil volume $\phi_{o,im}$.

In immature shale source rocks where, $\phi_w = \phi$, equation (10) for $V_k$ reduces to, $$V_k = \frac{\rho_{ma} \cdot (1 - \phi) \cdot TOC}{\rho_{ma} \cdot TOC + c_k \rho_k}. \quad (18)$$

In deriving equations (13)-(15) we recalled equation (4) and wrote, $$\phi_g = \phi_g(0) + aV_k, \quad (19)$$

where, $$\phi_g(0) = \frac{DPHI - \frac{\phi_{nmr}}{HI_f}}{\left(1 - \frac{HI_g}{HI_f}\right) + \lambda}, \quad (20)$$

and, $$a = \frac{-\lambda_2}{\left(1 - \frac{HI_g}{HI_f}\right) + \lambda}. \quad (21)$$

The coefficients A and B are independent of $V_k$, however, as can be seen from equation (14) the coefficient A depends on the water-filled porosity $\phi_w$. The other parameters defining A and B are either derived from neutron spectroscopy logging measurements, e.g., TOC and $\rho_{ma}$, or they are user defined inputs, e.g., $c_o$, $c_g$, $c_k$, $\rho_o$, $\rho_g$, $\rho_k$, etc.

High-frequency dielectric logging tools were first introduced in the industry in the 1970s. These tools went through several generations of design improvements. Today these tools operate at multiple frequencies in the approximate range from 20 MHz to 1 GHz. During a logging operation one or more transmitters that are pressed against the borehole wall emit electromagnetic waves that propagate in the formation. The phase shifts and attenuations of the waves are measured between one or more receiver pairs that are displaced from the transmitter. The measured phase shifts and attenuations depend on the dielectric permittivity of the formations. The phase shift and attenuation measurements can be inverted to determine the dielectric constants and conductivities of the formations. The relative dielectric constants of minerals and hydrocarbons are about a factor of ten smaller than the dielectric constant of the brine (or water) which has a relative dielectric constant of about 80. By using a rock physics model for the dielectric constant of the fluid-filled rock together with the measured rock porosity, and knowledge of the dielectric constants of brine, hydrocarbons, kerogen, and the mineral matrix one can estimate a water-filled porosity.

The water-filled porosity in equation (14) can be estimated from the permittivity measured by a high frequency dielectric logging tools. The basic principle is that the dielectric constant of water is more than an order of magnitude larger than the dielectric constants of most rock minerals and hydrocarbons. For measurements of dielectric permittivity made in fluid-filled rocks at high frequencies (e.g., at 1 GHz) surface polarization effects which can lead to high apparent dielectric constants at lower frequencies become negligible and the measured dielectric constants and/or conductivities can be used to derive $\phi_w$. Measurements of dielectric permittivity made at multiple frequencies can also be used to determine water-filled porosity in reservoir rocks (as described in U.S. Pat. No. 7,376,514, the contents of which are hereby incorporated by reference). Other methods such as determining water-filled porosity from NMR T1 and T2 relaxation times logs can also be used to estimate water-filled porosity (as described in Vivek Anand, et al. "New Generation NMR Tool for Robust, Continuous T1 and T2 Measurements," SPWLA 56$^{th}$ Logging Symposium, Jul. 18-22, 2015, the contents of which are hereby incorporated by reference). In the future, if induced polarization logging tools are popularized, it may be possible to derive $\phi_w$ from low-frequency induced polarization measurements (as shown in U.S. Pat. No. 4,359,687, the contents of which are hereby incorporated by reference). It should be understood that other measurements can be used to estimate $\phi_w$ including resistivity measurements. The water volumes $\phi_w$ in organic shale reservoirs may be low and the reservoir outputs determined using the teachings in this disclosure display little sensitivity to the water-filled porosity. Note that both A and B are independent of $V_k$ so if we substitute (13) for $V_k$ in equation (3) for $\phi$ and solve the resulting linear equation one finds that the fluid and kerogen corrected total porosity is, $$\phi = \frac{\left(1 - \frac{HI_g}{HI_f}\right)DPHI + \lambda \frac{\phi_{nmr}}{HI_f} - \left(1 - \frac{HI_g}{HI_f}\right)\lambda_2 A}{\left(1 - \frac{HI_g}{HI_f}\right) + \lambda + \left(1 - \frac{HI_g}{HI_f}\right)\lambda_2 B}. \quad (22)$$

The quantities in (22) are either log derived measurements or user defined input parameters. The volume of kerogen $V_k$ can then be computed using equation (13) after computing $\phi$ from equation (22). The gas-filled porosity $\phi_g$ and the gas saturation can then be computed by substitution of $V_k$ into equations (4) and (8), respectively. The immobile oil-filled porosity can be computed using equation (16). The foregoing workflow for shale gas reservoirs can be summarized by the flowchart shown in FIG. 4. It is understood that an analogous workflow chart can be constructed for shale oil reservoirs where the light hydrocarbon is light oil.

For organic shales that are known to have a level of maturity that is clearly in the gas window such that $\phi_o=0$ (e.g., no bitumen or immobile oil) such that $\phi=\phi_w+\phi_g$ one also finds from equation (10) that, $$V_k = A + B\phi, \quad (23)$$

where for this case, $$A = \frac{\rho_{ma} \cdot TOC - c_g \rho_g \phi_g(0)}{\rho_{ma} \cdot TOC + ac_g \rho_g + c_k \rho_k}, \quad (24)$$

and, $$B = -\frac{\rho_{ma} \cdot TOC}{\rho_{ma} \cdot TOC + ac_g \rho_g + c_g \rho_k} \quad (25)$$

which can be computed from logging inputs and user specified parameters. Observe that for this case (i.e., a mature gas reservoir with no immobile oil) equations (24) and (25) do not depend on $\phi_w$ so that just density, NMR, and neutron spectroscopy measurements are used to determine $\phi$, $\phi_g$, $S_g$, $\phi_w$, $S_w$, and $V_k$.

Figure 5:
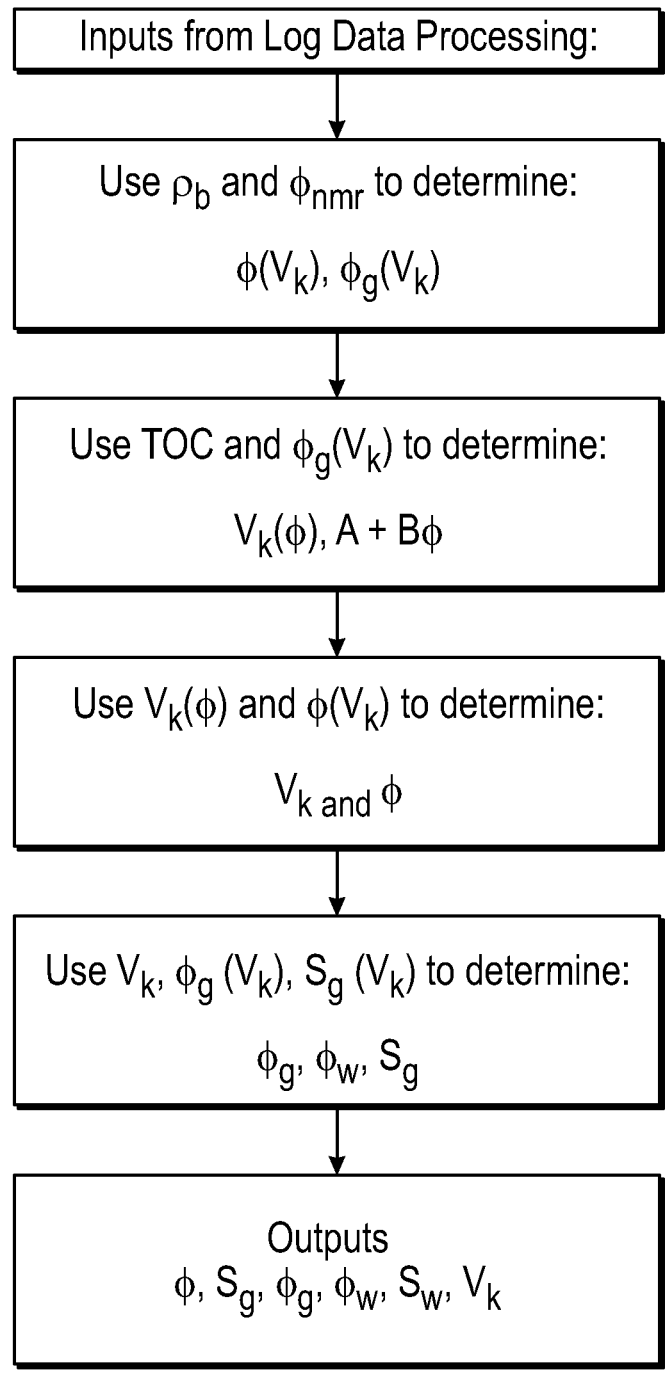
FIG. 5 is a formation evaluation workflow for mature shale gas reservoirs.

The workflow for organic shale reservoirs that are in the very mature gas window such that equations (23)-(25) are valid is summarized in FIG. 5.

Figure 4:
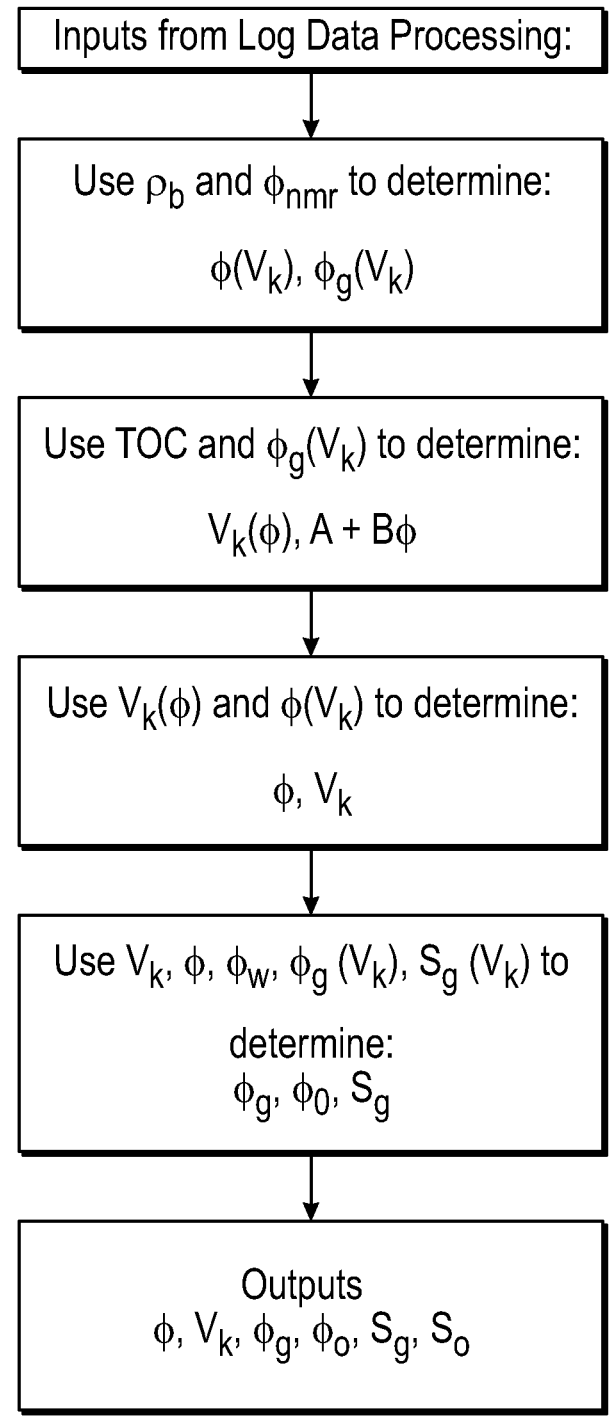
FIG. 4 is a formation evaluation workflow for immature shale gas reservoirs.

The outputs of the workflows shown in FIGS. 4 and 5 are some of the reservoir parameters that can be used to predict the depths of the most probable "pay zones" based on total porosity, fluid saturations, and fluid types. In conventional reservoirs this information is what is helpful, in many cases, to select perforation depths for completion of the well. In unconventional wells and very tight conventional reservoirs commercial production rates involve massive hydraulic fracturing.

The workflows presented in FIGS. 4 and 5 are understood to provide reservoir quality indicators that can be determined from the fluid volumes. For example, in shale oil reservoirs field experience has shown that bitumen and kerogen can block and reduce the flow rates of light oil. The value of a reservoir quality ratio, for example, $$RQ = \frac{\phi_o}{\phi_{o,im} + V_k}, \quad (26)$$

can be used as an additional indicator of reservoir quality. It is understood that there are many other reservoir quality indicators that can be constructed from the outputs in FIGS. 4 and 5.

Developmental wells drilled in organic shale reservoirs are often long horizontal wells where the wellbore is in contact with the shale for many thousands of feet. In these wells it is useful to select the pay zone vertical depths based on reservoir parameters and it is equally useful to have knowledge of the geo-mechanical properties of the shale. Specifically, for the hydraulically induced fractures to propagate effectively into the shale reservoir it is helpful that the shale is brittle rather than ductile. It has been learned through industry experience that the brittleness depends on the detailed mineralogy. For example, if the clay content of the shale matrix is too high (e.g., 70%) then the shale behaves like a ductile or plastic material and much of the fracture energy is absorbed by deformation instead of by fracture initiation and propagation. In this case the expensive fracture stimulation would not be successful. Therefore knowledge of detailed mineralogy is useful information in determining which zones are most likely to enable efficient fracturing of the shale. It is desirable to have large weight fractions of framework minerals such as calcite and quartz which are more brittle (e.g., have lower Poisson ratios) than clays.

The mineralogical dry weight fractions are determined simultaneously with the dry weight matrix densities using neutron spectroscopy logging tool measurements (as shown in US Pat. Pub. 2014/0214324, the contents of which are hereby incorporated by reference) and provide information and inputs into the determination of the reservoir's production potential following stimulation by hydraulic fracturing. The determination of the mineral weight fractions, although not shown explicitly, is understood to be part of the workflow in FIGS. 4 and 5.

It is understood that the formation evaluation method disclosed herein is independent of the method of conveyance of the logging tools. In some cases the data will be acquired in a vertical section of the subject well and be used to decide on the depth to land the horizontal portion of the well. If the data are acquired in a horizontal well then the formation evaluation outputs disclosed here would provide the optimal locations for perforations and for hydraulic fracture stimulation.

The total porosity in equation (22) can undercall or underrepresent the total porosity if bitumen or other very viscous oil is present that is not measured by the NMR log. To recover the missing porosity and also to make corrections to $V_k$, $\phi_g$ and other reservoir outputs we make use of the fact that the density log measures the fluid-filled porosity including the viscous bitumen. The method for computing the bitumen-filled porosity is to first substitute $V_k$ and $\phi_g$ (i.e., the outputs in FIGS. 4 and 5) into equation (1) for the bulk density and solve for the porosity one finds that, $$\phi = \frac{-\rho_b + (1 - V_k)\rho_{ma} + \rho_k V_k - (\rho_f - \rho_g)\phi_g}{\rho_{ma} - \rho_f}, \quad (A.1)$$

To proceed we write an equation for the updated total porosity in the form, $$\phi^{(n)} = \phi(\rho_b, V_k^{(n-1)}, \phi_g^{(n-1)}) \quad (A.2)$$

where n=1,2, . . . is an iteration index and we have defined, $$V_k^{(n)} = A + B\phi^{(n)}, \quad (A.3)$$

and, $$\phi_g^{(n)} = \phi_g(V_g^{(n)}). \quad (A.4)$$

The iteration in (A.2) starts by setting n=1 where $V_k^{(0)}$ and $\phi_g^{(0)}$ are zeroth order estimates and are the outputs in FIGS. 4 and 5. Then using (A.3) and (A.4) the kerogen volume and gas-filled porosity are updated and then one updates the iteration counter by setting n=2 in (A.2) to update the total porosity. The iteration continues until convergence is achieved after N iterations such that, for example, $$|\phi^{(N)} - \phi^{(N-1)}| < \varepsilon, \quad (A.5)$$

where $\varepsilon$ is a tolerance parameter. In (A.5) we specified a stopping condition for the iteration based on the absolute difference, however, one could also use a relative difference. Once the stopping condition in (A.5) is satisfied the reservoir outputs corrected for bitumen and very viscous oil missed by the NMR measurement are: (1) corrected total shale porosity $\phi^{(N)}$, (2) corrected gas-filled porosity $\phi_g^{(N)}$, and (3) corrected kerogen volume $V_k^{(N)}$. The missing porosity if any can be computed from $$\Delta\phi_{bit} = \phi^{(N)} - \phi(\rho_b, V_k^{(0)}, \phi_g^{(0)}) \quad (A.6)$$

Other corrected outputs such as, for example, the corrected volume of immobile oil see equation (16) in this specification), may be determined as:

$$\phi_o^{(N)} = \phi^{(N)} - \phi_g^{(N)} - \phi_w. \quad (A.7)$$

Here, a shale gas reservoir was considered, however, this disclosure encompasses the application of the same method to a shale oil reservoir to correct for bitumen porosity missed by the NMR measurement.

Although methods and apparatus have been described in detail, it should be understood that various changes, substitutions and alternations can be made herein without departing from the spirit and scope of the disclosure as defined by the appended claims.

What is claimed is:

1. A method comprising:
   estimating a total porosity of an earth formation as a function of bulk density and total nuclear magnetic resonance (NMR) porosity of the earth formation, using a processor, wherein the total porosity of the earth formation as estimated underrepresents bitumen content of the earth formation;
   estimating a gas filled porosity of the earth formation as a function of the bulk density and the total NMR porosity, using the processor;
   estimating a kerogen volume of the earth formation as a function of the gas filled porosity and a total organic carbon content of the earth formation, using the processor;
   determining a bitumen filled total porosity of the earth formation as a function of the estimated kerogen volume and the estimated total porosity of the earth formation, using the processor;
   determining a corrected kerogen volume of the earth formation by iteratively updating the estimated kerogen volume and the estimated total porosity of the earth formation until a tolerance between the updated estimated porosity of the earth formation and the estimated porosity of the earth formation is below a tolerance threshold, using the processor; and
   determining a pay zone depth within the earth formation using at least the corrected kerogen volume of the earth formation.

2. The method of claim 1, further comprising determining at least one of a gas filled porosity of the earth formation, shale gas saturation, and oil filled porosity as a function of the bitumen filled total porosity and corrected kerogen volume, using the processor.

3. The method of claim 2, wherein the earth formation comprises an immature shale gas reservoir.

4. The method of claim 1, further comprising determining at least one of a gas filled porosity and water filled porosity of the earth formation as a function of the bitumen filled total porosity and corrected kerogen volume, using the processor.

5. The method of claim 4, wherein the earth formation comprises a mature shale gas reservoir.

6. The method of claim 1, further comprising estimating an uncorrected shale gas saturation of the earth formation as a function of the estimated kerogen volume, using the processor.

7. The method of claim 6, further comprising determining a corrected shale gas saturation of the earth formation as a function of the uncorrected shale gas saturation and the estimated kerogen volume, using the processor.

8. The method of claim 1, further comprising determining the bulk density of the earth formation using a nuclear radiation based density logging tool, determining the total NMR porosity using a NMR logging tool, and determining the total organic carbon content of the earth formation using a nuclear radiation based spectroscopy logging tool.

9. The method of claim 1, wherein the total NMR porosity is a function of NMR spin echo signals of hydrogen nuclei in liquids and gases within the earth formation.

10. The method of claim 1, wherein the total NMR porosity is a function of NMR spin echo signals of hydrogen nuclei in solids, liquids, and gases within the earth formation.

11. A system comprising:
    at least one well logging tool configured to acquire formation bulk density data, nuclear magnetic resonance (NMR) porosity data, and organic carbon content data from an earth formation;
    a processor cooperating with the at least one well logging tool and configured to:
    determine a bulk density of the earth formation from the formation bulk density data, determine a total NMR porosity of the earth formation from the NMR porosity data, and determine a total organic carbon content of the earth formation from the total organic content data;

estimate a gas filled porosity of the earth formation as a function of the bulk density and the total NMR porosity;

estimate a kerogen volume of the earth formation as a function of the gas filled porosity and the total organic carbon content of the earth formation;

determine a bitumen filled total porosity of the earth formation as a function of the estimated kerogen volume and an estimated total porosity of the earth formation;

determine a corrected kerogen volume of the earth formation by iteratively updating the estimated kerogen volume and the estimated total porosity of the earth formation until a tolerance between the updated estimated porosity of the earth formation and the estimated porosity of the earth formation is below a tolerance threshold; and determine a pay zone depth within the earth formation using at least the corrected kerogen volume of the earth formation.

12. The system of claim 11, wherein the processor is further configured to estimate the total porosity of an earth formation as a function of bulk density and total nuclear magnetic resonance (NMR) porosity of the earth formation, wherein the total porosity of the earth formation as estimated underrepresents bitumen content of the earth formation.

13. The system of claim 11, wherein the processor is further configured to determine at least one of a gas filled porosity of the earth formation, shale gas saturation, and oil filled porosity as a function of the bitumen filled total porosity and corrected kerogen volume.

14. The system of claim 11, wherein the processor is further configured to determine at least one of a gas filled porosity and water filled porosity of the earth formation as a function of the bitumen filled total porosity and corrected kerogen volume.

15. The system of claim 11, wherein the processor is further configured to estimate an uncorrected shale gas saturation of the earth formation as a function of the estimated kerogen volume.

16. The system of claim 15, wherein the processor is further configured to determine a corrected shale gas saturation of the earth formation as a function of the uncorrected shale gas saturation and the estimated kerogen volume.

17. A method comprising:

estimating a gas filled porosity of an earth formation as a function of bulk density and total NMR porosity of the earth formation, using a processor;

estimating a kerogen volume of the earth formation as a function of the gas filled porosity, using the processor;

determining a bitumen filled total porosity of the earth formation as a function of the estimated kerogen volume and an estimated total porosity of the earth formation, using the processor;

determining a corrected kerogen volume of the earth formation by iteratively updating the estimated kerogen volume and the estimated total porosity of the earth formation until a tolerance between the updated estimated porosity of the earth formation and the estimated porosity of the earth formation is below a tolerance threshold, using the processor; and determining a pay zone depth within the earth formation using at least the corrected kerogen volume of the earth formation.

18. The method of claim 17, further comprising determining at least one of a gas filled porosity of the earth formation, shale gas saturation, and oil filled porosity as a function of the bitumen filled total porosity and corrected kerogen volume, using the processor.

19. The method of claim 17, further comprising determining at least one of a gas filled porosity and water filled porosity of the earth formation as a function of the bitumen filled total porosity and corrected kerogen volume, using the processor.

20. The method of claim 17, further comprising:

estimating an uncorrected shale gas saturation of the earth formation as a function of the estimated kerogen volume, using the processor; and determining a corrected shale gas saturation of the earth formation as a function of the uncorrected shale gas saturation and the estimated kerogen volume, using the processor.

* * * * *